(12) United States Patent
Chiang

(10) Patent No.: US 6,425,108 B1
(45) Date of Patent: Jul. 23, 2002

(54) REPLACEMENT OF BAD DATA BIT OR BAD ERROR CONTROL BIT

(75) Inventor: Kevin Chiang, Fremont, CA (US)

(73) Assignee: Qak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/306,753

(22) Filed: May 7, 1999

(51) Int. Cl.⁷ .............................................. G11C 29/00
(52) U.S. Cl. .................. 714/764; 714/799; 714/723
(58) Field of Search ............................... 714/710, 702, 714/766, 723, 704, 799, 764, 763, 718; 365/200

(56) References Cited

U.S. PATENT DOCUMENTS

| | | | | | |
|---|---|---|---|---|---|
| 4,475,194 A | * | 10/1984 | LaVallee et al. | ............ | 714/710 |
| 4,479,214 A | * | 10/1984 | Ryan | ......................... | 714/702 |
| 4,903,268 A | * | 2/1990 | Hidaka et al. | ............... | 714/766 |
| 5,233,614 A | * | 8/1993 | Singh | .......................... | 714/723 |
| 5,640,353 A | * | 6/1997 | Ju | ............................... | 365/200 |
| 5,974,576 A | * | 10/1999 | Zhu | ............................ | 714/704 |
| 5,996,096 A | * | 11/1999 | Dell et al. | .................. | 714/710 |

* cited by examiner

Primary Examiner—David Ton
(74) Attorney, Agent, or Firm—John F. Schipper

(57) ABSTRACT

Method and system for limiting the effects of data bit cell errors or error control bit errors that are uncorrectable in a computer. When a corrupted data bit cell is found, the content of the corrupted data bit cell is replaced by an error control bit from an error control bit segment associated with the data bit segment, the error control procedure for this (modified) data bit segment is disabled, and this modified data bit segment is flagged to indicate that the error control procedure for this modified data bit segment is disabled. A corrupted error control bit cell is processed in a similar manner. When a correctable bit error, not stored in a corrupted bit cell, is found, the bit error is corrected by the error control mechanism.

8 Claims, 4 Drawing Sheets

REPLACEMENT OF BAD DATA BIT OR BAD ERROR CONTROL BIT

FIELD OF THE INVENTION

This invention relates to use of error control bits to compensate for corrupted memory cells.

BACKGROUND OF THE INVENTION

Error control of a digital signal transferred from one site to another is often implemented by use of error control bits (parity, CRC, syndrome polynomials) that are associated with a segment of the signal to be transferred. However, one or more of the digital signal bits may become corrupted through a process that is not associated with, or that does not permit correction by use of, the error control bits associated with that segment. This may occur when a memory cell becomes corrupted and will not accept and hold a particular voltage value, corresponding to a "zero" or a "one." In this situation, an entire digital signal segment may become unusable although only one or a few of the digital signal bits in memory are "bad."

Segments containing data bits and segments containing the associated error control bits are traditionally stored in fixed locations in separate regions in a digital computer memory. This approach is acceptable if a data bit segment is either correct, as interrogated using a selected error control procedure, or if the data bit is erroneous but can be corrected using the error control procedure. However, if the data bit segment contains one or more bit errors that cannot be so corrected, an entire region in memory can be compromised and rendered unusable.

What is needed is an approach that can reduce or minimize the disruption of a data bit segment in which one or more erroneous and uncorrectable data bits are found and should allow subsequent identification of any such data bit segments. Preferably, the approach should not affect a data bit segment that either contains no errors or contains only correctable data bit errors. Preferably, the approach should involve processing of only the bits in the data bit segment and in the associated error control bit segment.

SUMMARY OF THE INVENTION

These needs are met by the invention, which (1) performs an error check on a data bit segment to determine if one or more data bit errors is present, and (2) where one or more data bit errors is present, determines whether the bit error(s) is correctable. Where the first question is answered "yes" and the second question is answered "no", the system replaces one or more data bits in this corrupted data bit segment by one or more error control bits, and flags the segment in which the replaced bit(s) is located, in order to disable application of the error control check(s) for that modified data bit segment.

DESCRIPTION OF THE INVENTION

Figure 1:
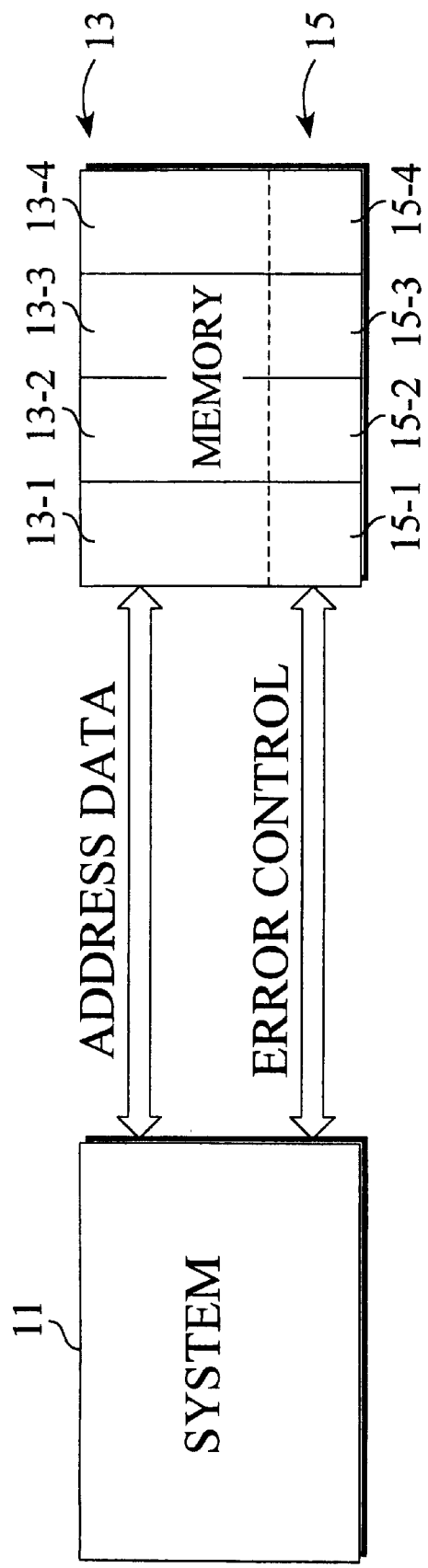
FIG. 1 illustrates a general relationship between a computer system (CPU, etc.) and a memory unit associated with the computer system.

FIG. 1 illustrates a conventional arrangement for transfer of data bits and error control bits between a computer system 11, optionally including a CPU, several registers, RAM, ROM, I/O ports, etc., a data memory unit 13 and an error control memory 15 that serve the computer system. The data memory unit 13 may include one or more data segments 13-1, 13-2, 13-3, 13-4 (each containing one or more bits) for data storage. The error control memory unit 15 may contain one or more separate error control segments 15-1, 15-2, 15-3, 15-4 (each containing one or more bits) associated with the respective segments 13-1, 13-2, 13-3, 13-4. Data bits are stored in the data memory unit 13 and error control bits are stored separately, in the error control memory unit 15.

A memory cell integrity test is often performed on a group of memory cells, by writing a zero into each cell, then reading the just written value, then writing a one into each cell, then reading the just written value. This test may be performed once or many times, and the order of writing of zeros and ones can be inverted. If data at one or more bit locations are erroneous and cannot be corrected (a "bad" or corrupted data bit cell), this may compromise a much larger region adjacent to the bad data cell location(s) and may render the associated segment and several adjacent segments of stored data unusable. Error segment information, indicating which, if any, segments contain one or more corrupted data bits and which error control segment(s) should be disabled for error control purposes, is stored into a register or memory in an address comparator for future reference and use.

The invention reduces or minimizes the effect of a bad data bit cell by replacing the bit value at the bad data bit cell location with an error control bit associated with a segment containing the bad data bit and disabling error control for the segment containing the bad data bit cell location. If, say, only one data bit cell is bad, all adjacent and non-corrupted data bit segments (not including the bad data bit segment) and their associated error control segments are thereby isolated from the bad data bit segment and can be used in the normal manner. Where a group of contiguous bad data bit cells occurs in a memory unit, these bad data bit cells can be isolated in one or a few contiguous data bit segments, and the contamination may be thereby limited by this "quarantine" process.

Figure 2:
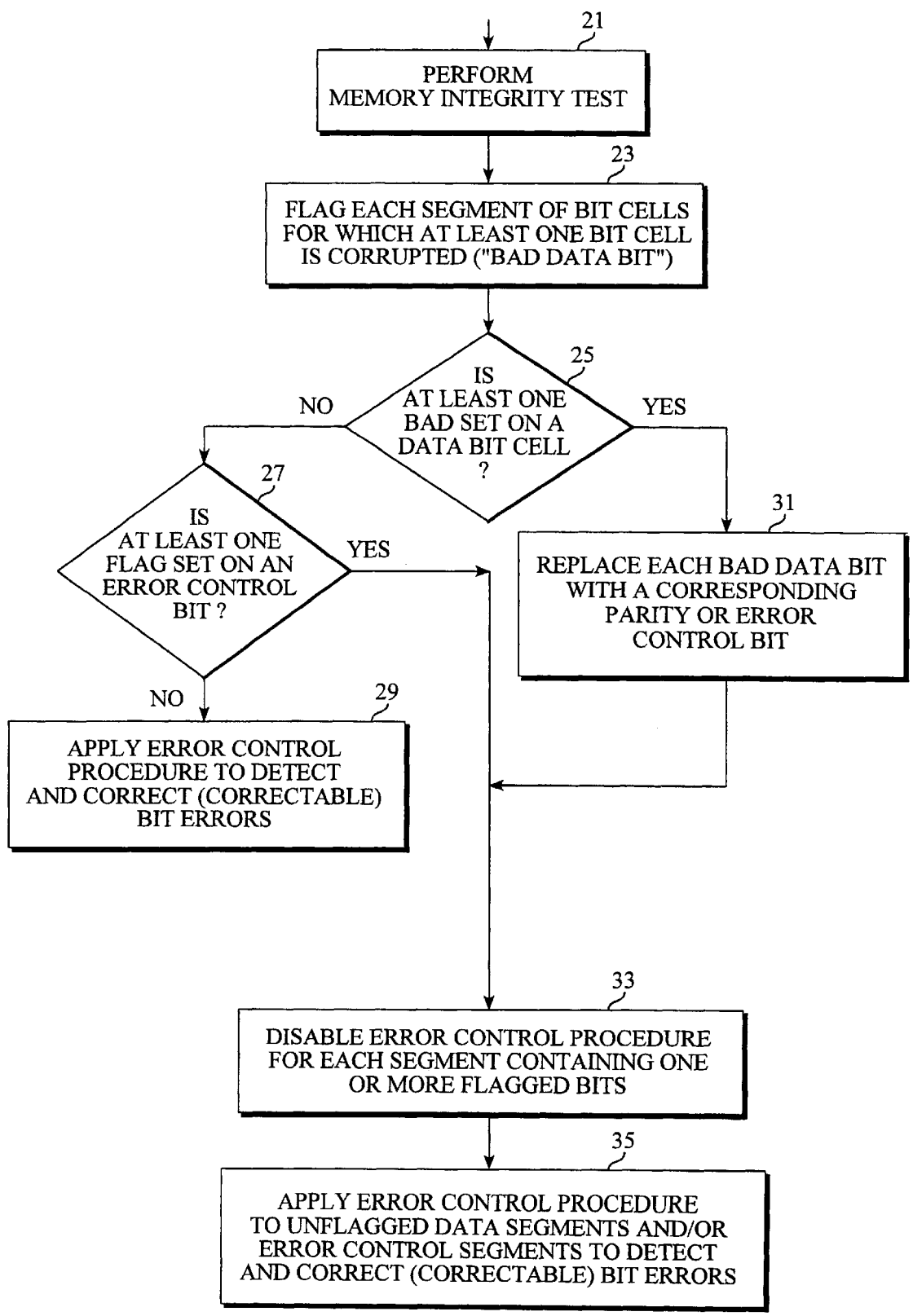
FIG. 2 is a flow chart of a suitable procedure for practicing the invention.

FIG. 2 is a flow chart of a suitable procedure for practicing one embodiment of the invention. In step 21, the system performs a memory integrity test on the memory cells. In step 23, each segment of a bad data bit cell and/or a bad error control bit cell that is corrupted or "bad" (as determined by the memory integrity test) is flagged. In step 25, the system determines: Is at least one data bit cell flagged? If the answer to the question in step 25 is "no", the system determines, in step 27, if at least one error control bit cell is flagged? If the answer to the question in step 27 is "no", the system proceeds to step 29 (optional) and applies a selected error control procedure to detect and correct any correctable bit errors. if the answer to the question in step 27 is "yes", the system proceeds to step 33

If the answer to the question in step 25 is "yes", the system replaces each data bit in a bad data bit cell with a corresponding parity or error control bit, in step 31, and proceeds to step 33. In step 33, the error control procedure is disabled for each segment (bad data bit, bad error control bit, or both) that contains one or more flagged bits. In step 35 (optional), the system applies the error control procedure to unflagged segments (data or error control or both) to detect and correct (correctable) bit errors. When a memory integrity test is performed, a segment address containing at least one corrupted data bit is stored in an address comparator.

Figure 3:
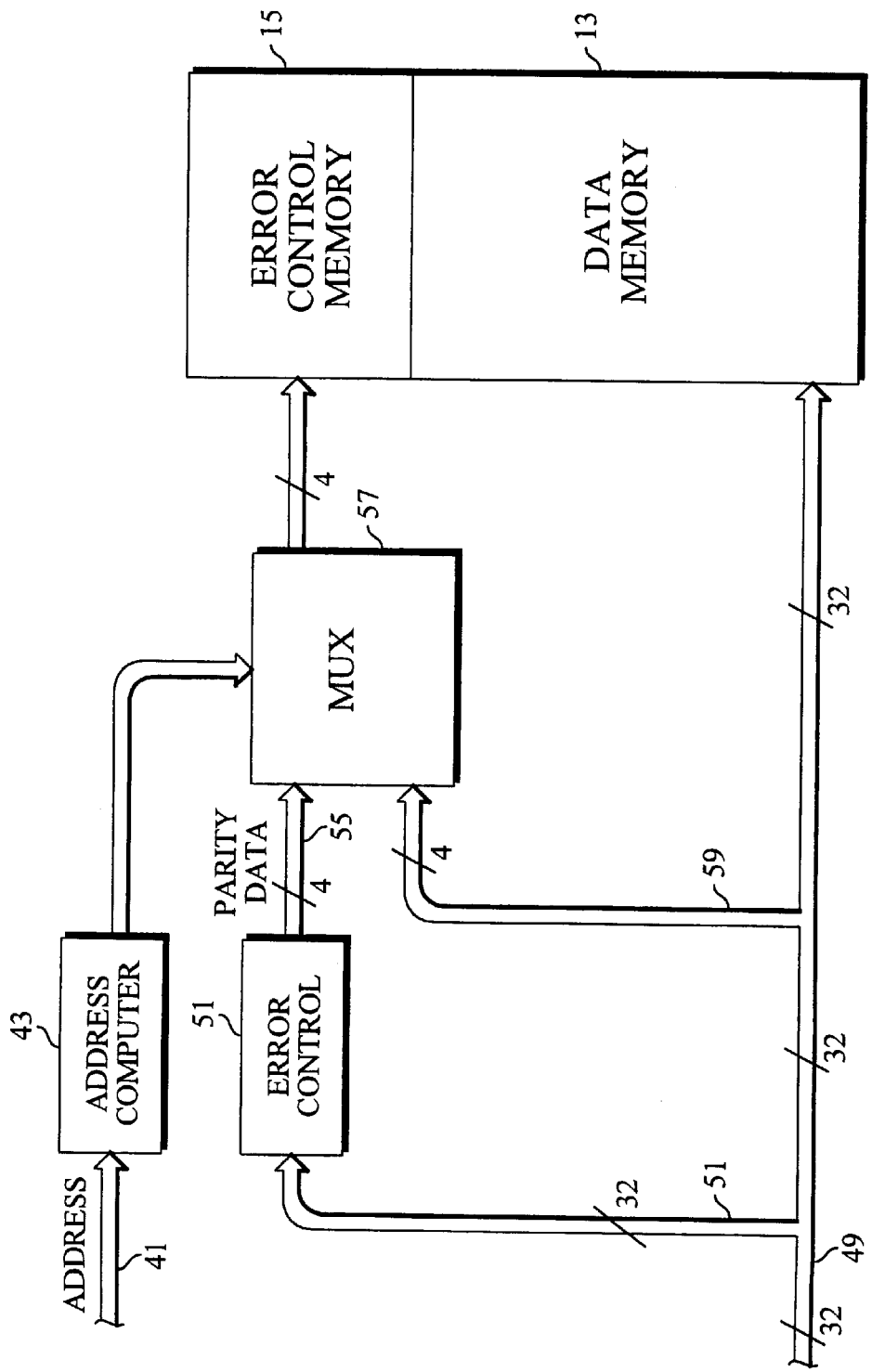
FIGS. 3 and 4 are schematic views of apparatus suitable for practicing the invention.

FIG. 3 is a schematic view of apparatus suitable for practicing the "write" process embodiment of the invention illustrated in FIG. 2. An address indicium or other identifier arrives on an address line 41 and is received at an address comparator 43. The address comparator 43 (1) examines the segment address for each segment of a data element, (2) determines whether the presently examined segment corresponds to a corrupted data bit and (3) issues an address comparison output signal (one bit or more) on a comparator output line 45, indicating whether the presently examined segment requires replacement and error control disablement. This address comparison output signal is received by a signal multiplexer and error control module (MUX/EC) 47. Data bits are transmitted on a 32-bit first data/EC line 49, and all 32 bits are received by an error control module 53 on a second data/EC line 51. These 32 bits are processed by the error control module, and four error control bits are passed on a 4-bit parity data line 55 to the MUX/EC 47. The MUX/EC 47 also receives four data bits from the 32-bit incoming signal.

All 32 bits on the first data/EC line 49 are identified and received on a third data/EC line 59 at the MUX/EC 57. The MUX/EC 57 will place four error control bits or four data bits into the error control memory 15, depending in part upon the comparator output signal received from the address comparator 43. The full 32 data bits on the data/EC line 49 are also received into the data memory unit 13.

Where one or more data bit errors are present in a 32-bit segment, the MUX/EC 47, as directed by the address comparator 43, replaces each bad data bit, or selected segment of data bits containing the bad data bit, in the data memory unit 13 with an error control bit, or segment of error control bits, corresponding to the segment containing the bad data bit. For each bad data bit, or segment containing one or more bad data bits, the corresponding portion of the error control procedure is disabled.

Figure 4:
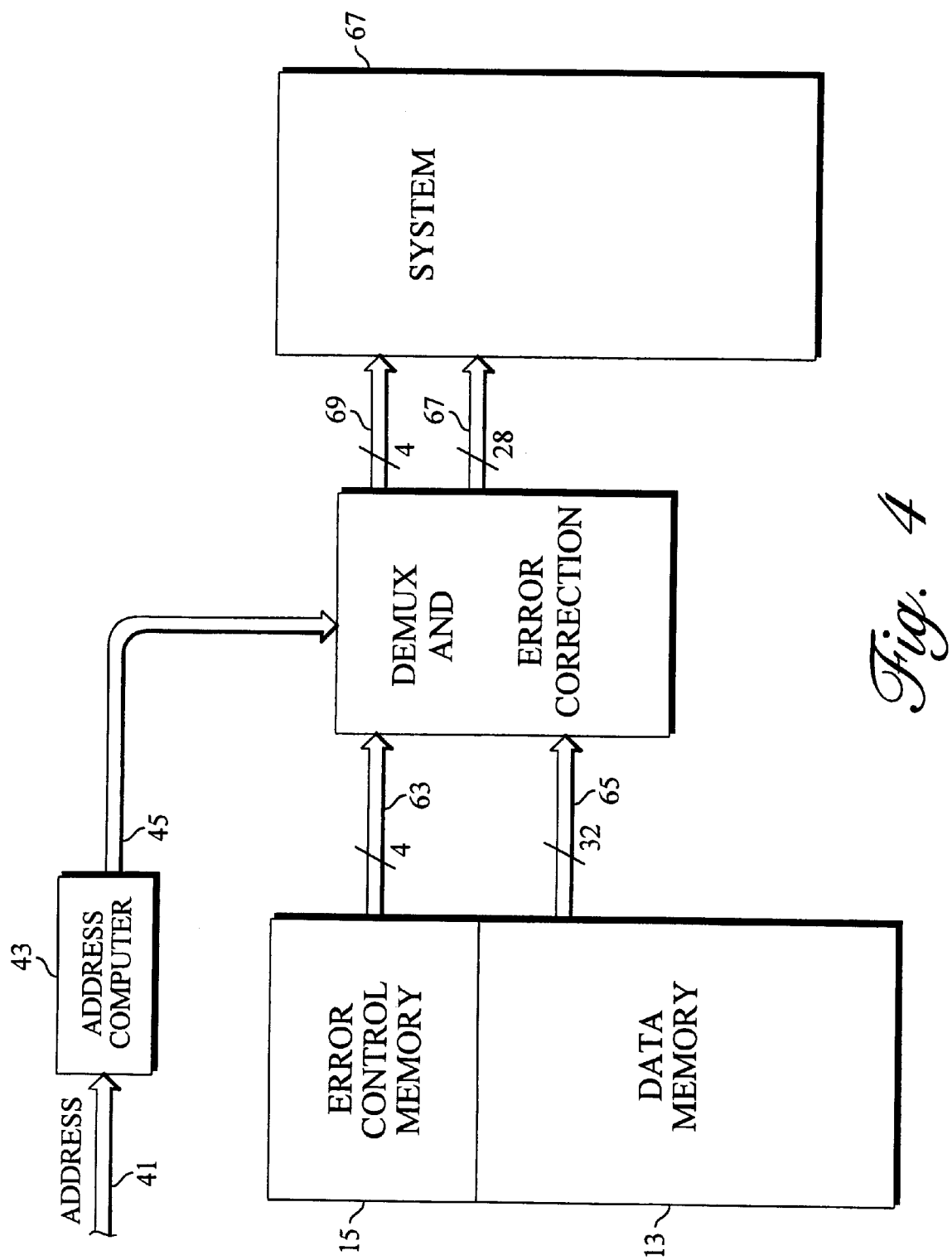

FIG. 4 is a schematic view of apparatus suitable for practicing the "read" process embodiment of the invention illustrated in FIG. 2. An address specification arrives on an address line 41 at an address comparator 43. The address comparator 43 issues an address comparison signal (one bit or more) on a comparator output line 45, and this signal is received by a signal demultiplexer and error control module (DEMUX/EC) 61. Four error control or parity bits, read from the error control memory unit 15, are received at the DEMUX/EC 61 on an EC line 63. At about this time, 32 data bits of a data element are read from the data memory unit 13 on a data line 65, and are received at the DEMUX/EC 61.

If the segment address read by the address comparator 43 is in a range corresponding to a correctable error, an ECC procedure is used to perform the correction. In this instance, the normal 32 bits of a data element are received at the system 69 from the DEMUX/EC 61 on a signal line 67. If the segment address read by the address comparator 43 is in a range corresponding to an uncorrectable error (corrupted data bit), the DEMUX/EC 61 will replace four of the 32 data bits received from the data memory 13 by a corresponding four error control bits received from the error control memory 15; and this modified 32-bit element will be received by the system 69 from the DEMUX/EC 61.

A corrupted bit cell can occur in one or more of the locations for the error control bits, as well as in a data bit cell. A bad error control bit cell would also be identified by a memory cell integrity test. If a bad error control bit cell is found, the byte in which this (bad) error control bit resides and any data bytes that correspond to this (bad) error control bit are preferably identified and quarantined by use of a flag or other indicium that indicates that this error control byte and these data bytes should not be used. As a supplementary action, the data bytes corresponding to this (bad) error control bit may be retransmitted and stored in another section of memory whose bit cells have all passed the memory cell integrity test. The flow chart in FIG. 2 also illustrates a procedure for dealing with corrupted bit cells that contain error control bits.

What is claimed is:

1. A method for control of errors in data stored as binary digits, referred to as "bits", the method comprising:

receiving at a computer a data bit segment, containing one or more data bits, and an associated error control bit segment, containing one or more error control bits used with a selected error control procedure for determining whether the associated data bit segment contains at least one data bit error, and storing the data bit segment and the error control bit segment at selected bit cell locations in a computer memory unit;

performing a memory integrity test on at least one bit cell location used to store the data bits, and flagging each data bit location that fails to pass the memory integrity test as a corrupted data bit location;

when at least one segment of data bit cells contains at least one bit cell that is corrupted, taking at least one of the following actions: (1) replacing at least one corrupted bit in the corrupted data bit segment by a selected bit in the associated error control bit segment to produce a modified data bit segment; (2) disabling the error control procedure for the at least one corrupted data bit segment; (3) providing an indicium that indicates that the error control procedure for the at least one corrupted data bit has been disabled; and (4) storing the modified data bit segment at the bit cell location provided for the data bit segment;

when no data bit segment contains at least one bit cell that is corrupted, performing a memory integrity test on at least one bit cell location within an error control segment associated with a selected data bit segment, and flagging each error control bit location that fails to pass the error control memory integrity test as a corrupted error control bit location; and when the associated error control segment contains at least one bit cell that is corrupted, taking at least one of the following actions: (1) flagging the at least one corrupted error control bit cell as a corrupted error control bit cell; (2) disabling at least one error control procedure that uses the at least one corrupted error control bit cell; and (3) providing an indicium that indicates that the error control procedure that uses the at least one corrupted error control bit has been disabled.

2. The method of claim 1, further comprising identifying said memory unit location of said at least one corrupted data bit in said data bit segment that is to be replaced by said selected bit in said associated error control bit segment to produce said modified data bit segment.

3. The method of claim 1, further comprising:

when said segment of said data bit cells does not contain at least one corrupted bit cell, and said data bit segment contains at least one correctable data bit error, correcting the at least one correctable data bit error in said data bit segment to produce a corrected data bit segment; and storing the corrected data bit segment at said memory unit location provided for said data bit segment.

4. The method of claim 1, further comprising:

when said no segment of said data bit cells contains at least one corrupted bit cell, storing at least one data bit segment, unmodified, at said memory unit location provided for said data bit segment.

5. A system for control of errors in data expressed as binary digits, referred to as "bits", the system comprising:

a computer, including a computer memory unit containing a plurality of memory cells, including a computer memory integrity test mechanism for testing the integrity of selected bit cells in the memory unit to determine whether at least one bit cell is corrupted, and including an error control mechanism for identifying and correcting at least one bit that includes a correctable error; and a multiplexer, connected to the computer, that receives a data bit segment containing one or more data bits, and that receives an associated error control bit segment that includes one or more error control bits used with a selected error control procedure for determining whether the associated data bit segment contains at least one bit error;

where the computer is programmed:
(1) to determine if a selected data bit cell segment containing a stored data bit segment contains at least one corrupted data bit cell;
(2) when the selected data bit cell segment does not contain at least one corrupted bit cell, to determine if each data bit error in the data bit segment is correctable using the error control mechanism; and
(3) when the selected data bit cell segment contains at least one corrupted bit cell, to cause at least one of the computer and the multiplexer to take at least one of the following actions: (i) replace at least one corrupted data bit in the corrupted bit cell segment by at least one selected bit in the associated error control bit segment to produce a modified data bit segment; (ii) disable the error control procedure for the at least one corrupted data bit segment; (iii) provide an indicium that indicates that the error control procedure for the at least one corrupted data bit has been disabled; and (iv) store the modified data bit segment at the bit cell location provided for the data bit segment;
(4) when no bit cell in the selected data bit cell segment is corrupted, to determine if an error control bit cell segment associated with the selected data bit cell segment contains at least one corrupted error control bit cell; and
(5) when at least one error control bit cell is corrupted, to take at least one of the following actions: (i) flag the at least one error control bit location that is corrupted; (ii) disable the error control procedure that uses the at least one corrupted error control bit cell; and (iii) provide an indicium that indicates that the error control procedure that uses the at least one corrupted error control bit cell has been disabled.

6. The system of claim 5, wherein said computer is further programmed to identify said memory unit location of said at least one corrupted data bit in said data bit segment that is to be replaced by said selected bit in said associated error control bit segment to produce said modified data bit segment.

7. The system of claim 5, wherein said computer is further programmed:

when said selected segment of said data bit cells does not contain at least one corrupted bit cell but said selected data segment contains at least one correctable data bit error, to correct the at least one correctable data bit error in said data bit segment to produce a corrected data bit segment; and to cause said multiplexer to store the corrected data bit segment at said bit cell location provided for said data bit segment.

8. The system of claim 5, wherein said computer is further programmed so that:

when said no segment of said data bit cells contains at least one corrupted bit cell, said multiplexer stores said data bit segment at said bit cell location provided for said data bit segment.

* * * * *